United States Patent
Chang et al.

(10) Patent No.: US 7,212,054 B1
(45) Date of Patent: May 1, 2007

(54) DLL WITH ADJUSTABLE PHASE SHIFT USING PROCESSED CONTROL SIGNAL

(75) Inventors: Tzung-chin Chang, San Jose, CA (US);
Chiakang Sung, Milpitas, CA (US);
Yan Chong, Mountain View, CA (US);
Henry Kim, San Jose, CA (US);
Joseph Huang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/479,660

(22) Filed: Jun. 29, 2006

Related U.S. Application Data

(63) Continuation of application No. 10/788,221, filed on Feb. 25, 2004, now Pat. No. 7,091,760.

(51) Int. Cl.
*H03L 7/06* (2006.01)

(52) U.S. Cl. ..................... 327/158; 327/161

(58) Field of Classification Search .............. None
See application file for complete search history.

(56) References Cited

U.S. PATENT DOCUMENTS

| | | | |
|---|---|---|---|
| 3,473,160 A | 10/1969 | Wahlstrom | 340/172.5 |
| 4,494,021 A | 1/1985 | Bell et al. | 307/591 |
| 4,633,488 A | 12/1986 | Shaw | 375/120 |
| 4,719,593 A | 1/1988 | Threewitt et al. | 364/900 |

(Continued)

FOREIGN PATENT DOCUMENTS

EP  0 266 065  9/1987

(Continued)

OTHER PUBLICATIONS

Advanced Micro Devices, Inc., "Am2971 Programmable Event Generator (PEG)," Publication No. 05280, Rev. C, Amendment /0, pp. 4-286-4-303 (Jul. 1986).

(Continued)

*Primary Examiner*—Timothy P. Callahan
*Assistant Examiner*—Cassandra Cox
(74) *Attorney, Agent, or Firm*—Fish & Neave IP Group of Ropes & Gray LLP; Robert R. Jackson

(57) ABSTRACT

Circuits and methods are described for producing a DLL clock signal with adjustable phase shift using a processed control signal. In one embodiment of the invention, a DLL circuit is provided that includes a main and smaller variable delay circuits, a phase detector and an up down counter that provides a main control signal to adjust the delay by the main variable delay circuit. When the DLL circuit is locked, an arithmetic logic unit (ALU) produces a processed control signal based on the main control signal, an ALU control signal and an offset control signal, and the processed control signal is provided to the smaller variable delay circuit. By adjusting the ALU control and offset control signals, the phase shift introduced on the DLL control signal by the smaller variable delay circuit can be adjusted. In another embodiment of the invention, a second up down counter is used in place of an ALU for providing a dynamically adjustable phase shift in accordance with the principles of the present invention.

18 Claims, 3 Drawing Sheets

U.S. PATENT DOCUMENTS

| | | | | |
|---|---|---|---|---|
| 4,857,866 | A | 8/1989 | Tateishi | 331/1 A |
| 4,868,522 | A | 9/1989 | Popat et al. | 331/2 |
| 4,959,646 | A | 9/1990 | Podkowa et al. | 340/825.83 |
| 5,072,195 | A | 12/1991 | Graham et al. | 331/2 |
| 5,075,575 | A | 12/1991 | Shizukuishi et al. | 307/465 |
| 5,079,519 | A | 1/1992 | Ashby et al. | 331/1 A |
| 5,133,064 | A | 7/1992 | Hotta et al. | 395/550 |
| 5,204,555 | A | 4/1993 | Graham et al. | 307/465 |
| 5,349,544 | A | 9/1994 | Wright et al. | 364/600 |
| 5,397,943 | A | 3/1995 | West et al. | 326/39 |
| 5,418,499 | A | 5/1995 | Nakao | 331/57 |
| 5,420,544 | A | 5/1995 | Ishibashi | 331/11 |
| 5,506,878 | A | 4/1996 | Chiang | 377/39 |
| 5,542,083 | A | 7/1996 | Hotta et al. | 395/550 |
| 5,581,214 | A | 12/1996 | Iga | 327/107 |
| 5,642,082 | A | 6/1997 | Jefferson | 331/25 |
| 5,646,564 | A | 7/1997 | Erickson et al. | 327/158 |
| 5,656,959 | A | 8/1997 | Chang et al. | 327/105 |
| 5,699,020 | A | 12/1997 | Jefferson | 331/17 |
| 5,742,180 | A | 4/1998 | DeHon et al. | 326/40 |
| 5,744,991 | A | 4/1998 | Jefferson et al. | 327/158 |
| RE35,797 | E | 5/1998 | Graham et al. | 326/40 |
| 5,777,360 | A | 7/1998 | Rostoker et al. | 257/315 |
| 5,815,016 | A | 9/1998 | Erickson | 327/158 |
| 5,815,017 | A * | 9/1998 | McFarland | 327/158 |
| 5,847,617 | A | 12/1998 | Reddy et al. | 331/57 |
| 5,883,534 | A | 3/1999 | Kondoh et al. | 327/158 |
| 5,900,757 | A | 5/1999 | Aggarwal et al. | 327/198 |
| 5,963,069 | A | 10/1999 | Jefferson et al. | 327/158 |
| 5,987,543 | A | 11/1999 | Smith | 710/70 |
| 6,011,732 | A | 1/2000 | Harrison et al. | 365/194 |
| 6,014,048 | A | 1/2000 | Talaga, Jr. et al. | 327/156 |
| 6,069,506 | A | 5/2000 | Miller, Jr. et al. | 327/156 |
| 6,069,507 | A | 5/2000 | Shen et al. | 327/156 |
| 6,094,082 | A | 7/2000 | Gaudet | 327/270 |
| 6,114,915 | A | 9/2000 | Huang et al. | 331/1 A |
| 6,137,325 | A * | 10/2000 | Miller, Jr. | 327/156 |
| 6,141,394 | A | 10/2000 | Linebarger et al. | 375/376 |
| 6,154,073 | A * | 11/2000 | Choi | 327/161 |
| 6,166,990 | A | 12/2000 | Ooishi et al. | 365/233 |
| 6,208,183 | B1 | 3/2001 | Li et al. | 327/161 |
| 6,255,870 | B1 | 7/2001 | Na | 327/149 |
| 6,278,332 | B1 | 8/2001 | Nelson et al. | 327/108 |
| 6,313,676 | B1 | 11/2001 | Abe et al. | 327/158 |
| 6,320,469 | B1 | 11/2001 | Friedburg et al. | 331/1 A |
| 6,388,485 | B2 | 5/2002 | Kim | 327/161 |
| 6,486,716 | B1 | 11/2002 | Minami et al. | 327/152 |
| 6,518,807 | B1 * | 2/2003 | Cho | 327/158 |
| 6,667,641 | B1 | 12/2003 | Wang et al. | 327/156 |
| 6,680,635 | B2 | 1/2004 | Lee | 327/158 |
| 6,683,928 | B2 * | 1/2004 | Bhullar et al. | 375/374 |
| 6,741,107 | B2 | 5/2004 | Borkar et al. | 327/153 |
| 7,002,384 | B1 * | 2/2006 | Chong et al. | 327/158 |
| 7,009,433 | B2 * | 3/2006 | Zhang et al. | 327/158 |
| 7,034,589 | B2 * | 4/2006 | Chao | 327/158 |
| 2001/0009385 | A1 * | 7/2001 | Lai et al. | 327/158 |

FOREIGN PATENT DOCUMENTS

| | | |
|---|---|---|
| EP | 0 416 930 | 3/1991 |
| EP | 0 778 517 | 6/1997 |
| JP | 1 137646 | 5/1989 |

OTHER PUBLICATIONS

Advanced Micro Devices, Inc., "AmPAL*23S8 20-Pin IMOX PAL-Based Sequencer," Publication No. 06207, Rev. B, Amendment /0, pp. 4-102-4-121 (Oct. 1986).

"DDR SDRAM/SGRAM Application Note," http://www.samsung.com/products/semiconductor/Dram/technicalinfo/appl.pdf (1998).

DynaChip Corp., "Application Note: Using Phase Locked Loops in DL6035 Devices" (1998).

DynaChip Corp., DY6000 Family Datasheet (Dec. 1998).

Ko, U., et al., "A 30-ps Jitter, 3.6 µs Locking, 3.3-Volt Digital PLL for CMOS Gate Arrays," *Proceedings of the IEEE 1993 Custom Integrated Circuits Conference*, Publication No. 0-7803-0826-3/93, pp. 23.3.1-23.3.4 (May 9-12, 1993).

LSI Logic Corp., 500K Technology Design Manual (Document DB04-000062-00, First Edition), pp. 8-1-8-33 (Dec. 1996).

Lucent Technologies, Inc., Optimized Reconfigurable Cell Array (ORCA®) OR3xxx/OR3Txxx Series Field-Programmable Gate Arrays, Preliminary Product Brief, (Nov. 1997).

Lucent Technologies, Inc., ORCA® Series 3 Field-Programmable Gate Arrays, Preliminary Data Sheet, Rev. 01 (Aug. 1998).

Monolithic Memories, Inc., "Programmable Array Logic PAL20RA10-20 Advance Information," pp. 5-95-5-102 (Jan. 1988).

Murphy, T., "How to Implement a DDR SDRAM Controller," http://www.xilinx.com/publications/xcellonline/xcell_47/xc_pdf/xc_ddr47.pdf (2003).

National Semiconductor Corp., *LVDS Owner's Manual & Design Guide* (Apr. 25, 1997).

Xilinx, Inc., Virtex 2.5V Field Programmable Gate Arrays Advance Product Specification (Version 1.0) (Oct. 20, 1998).

Xilinx, Inc., Application Note: Using the Virtex Delay-Locked Loop (Version 1.31) (Oct. 21, 1998).

Zaks, R., et al., *From Chips to Systems: An Introduction to Microcomputers*, pp. 54-61 (Prentice-Hall, Inc., Englewood Cliffs, N.J., 1987).

* cited by examiner

DLL WITH ADJUSTABLE PHASE SHIFT USING PROCESSED CONTROL SIGNAL

This is a continuation of U.S. patent application Ser. No. 10/788,221, filed Feb. 25, 2004, now U.S. Pat. No. 7,091,760, which is incorporated by reference herein in its entirety.

BACKGROUND OF THE INVENTION

The present invention relates to delay-locked loop (DLL) circuits. More particularly, this invention relates to DLL circuits for use in, for example, programmable logic devices (PLDs) or semiconductor memory devices for providing adjustable phase shift control of a DLL clock signal using a processed control signal.

In general, a PLD is a general-purpose integrated circuit device that is programmable to perform any of a wide range of logic tasks. It is known to incorporate one or more DLL circuits into PLDs to achieve a certain phase shift between clock and data signals as required by many different applications (e.g., for several memory interface standards). Alternatively, DLL circuitry may be incorporated directly into semiconductor memory devices or other types of circuitry. For example, a DLL circuit may be used to provide a data input/output timing signal, or data strobe signal (DQS), that is phase shifted with respect to an external, or reference clock signal. In turn, this phase shifted DQS may be used for clocking data into and out of a memory device during respective write and read cycles.

A conventional DLL circuit that provides a phase shifted DLL control signal based on a reference clock signal may include a pair of variable delay circuits (e.g., a main variable delay circuit and a second, smaller variable delay circuit), a phase detector and an up down counter that provides the main and smaller variable delay circuits with a main control signal. The phase detector compares the reference clock signal with a delayed version of the reference clock signal, or internal clock signal, that is produced by the main variable delay circuit. Based on this comparison, the phase detector either increments or decrements the up down counter. In response, the main control signal produced by the up down counter is adjusted to either increase or decrease the delay setting of the main variable delay circuit. This process repeats, with the internal clock signal coming closer in phase to the reference clock signal following each adjustment to the delay setting of the main variable delay circuit.

Once the DLL circuit is locked (i.e., the internal clock signal and the reference clock signal are in phase), the main control signal is set such that the delay by the main variable delay circuit is equal to one complete clock cycle of the reference clock signal. At this time, the main control signal is also used to control the delay setting of the smaller variable delay circuit, which provides a certain phase shift to a DQS. Depending on the relative sizes of the main and smaller variable delay circuits (e.g., the number of delay stages in the smaller variable delay circuit compared to the number of delay stages in the main variable delay circuit), a particular phase shifted DQS is generated.

With conventional DLL circuits such as described above, the phase shift for DQS when the DLL circuit is locked is not adjustable once the size relationship between the main and smaller variable delay circuits is set. For example, if the frequencies of the reference clock signal and the DLL clock signal are substantially identical, and the smaller variable delay circuit is one-fourth the size of the main variable delay circuit, then the DLL clock signal will be shifted by one-fourth of a complete clock cycle (i.e., 90°) when the DLL circuit is locked. Many applications, however, require the phase shift of a DLL clock signal (e.g., a DQS) to be adjustable even after the size relationship between the main and smaller variable delay circuits is set.

Therefore, DLL circuitry is needed that is capable of providing a DQS or other type of DLL clock signal with adjustable phase shift even after the size relationship between the main and smaller variable delay circuits has been set.

SUMMARY OF THE INVENTION

In accordance with the principles of the present invention, circuits and methods for providing a DQS (or any other suitable DLL clock signal) with an adjustable phase using a processed control signal are described herein.

In a first implementation of the invention, a DLL circuit is provided that includes a main variable delay circuit, a second, smaller variable delay circuit, a phase detector and an up down counter for providing a main control signal, each of which operates substantially as described above. The DLL circuit according to the invention, however, also includes a processing circuit. In a first embodiment, the processing circuit includes an arithmetic logic unit (ALU). The ALU receives the main control signal produced by the main variable delay circuit, and, in response to an ALU control signal and an offset control signal, produces a processed control signal that is provided to the smaller variable delay circuit. When the DLL circuit is locked, the smaller variable delay circuit provides a phase shift to the DQS based on the processed control signal. Given that the ALU control and offset control signal may be provided directly by user inputs or any other suitable source and may be varied during operation of the DLL circuit, the phase shift of DQS is adjustable even after the size relationship between the main and smaller variable delay circuits is set.

In another implementation of the invention, a DLL circuit is provided that, as with the first implementation, includes a main variable delay circuit, a second, smaller variable delay circuit, a phase detector, an up down counter for providing a main control signal and a processing circuit. Instead of an ALU, however, the processing circuit of the DLL circuit includes a second up down counter for producing a processed control signal. An initial counter value signal is used to set an offset value between the two up down counters, which, during operation of the DLL, are synchronously incremented or decremented based on the output signals provided by the phase detector. When the DLL circuit is locked, the control signal from the second up down counter (i.e., the processed control signal) is used to control the delay setting of the smaller variable delay circuit. Accordingly, by adjusting the initial counter value signal, which may also be provided directly by user inputs or any other suitable source, the phase shift of the DQS by the smaller variable delay circuit can be adjusted even after the size relationship between the main and smaller variable delay circuits is set.

BRIEF DESCRIPTION OF THE DRAWINGS

Further features of the invention, its nature and various advantages will be more apparent upon consideration of the following detailed description, taken in conjunction with accompanying drawings, in which like reference characters refer to like parts throughout, and in which.

DETAILED DESCRIPTION OF THE INVENTION

The present invention relates to DLL circuits that provide a DLL clock signal (e.g., a DQS) with an adjustable phase shift using a processed control signal.

Figure 1:
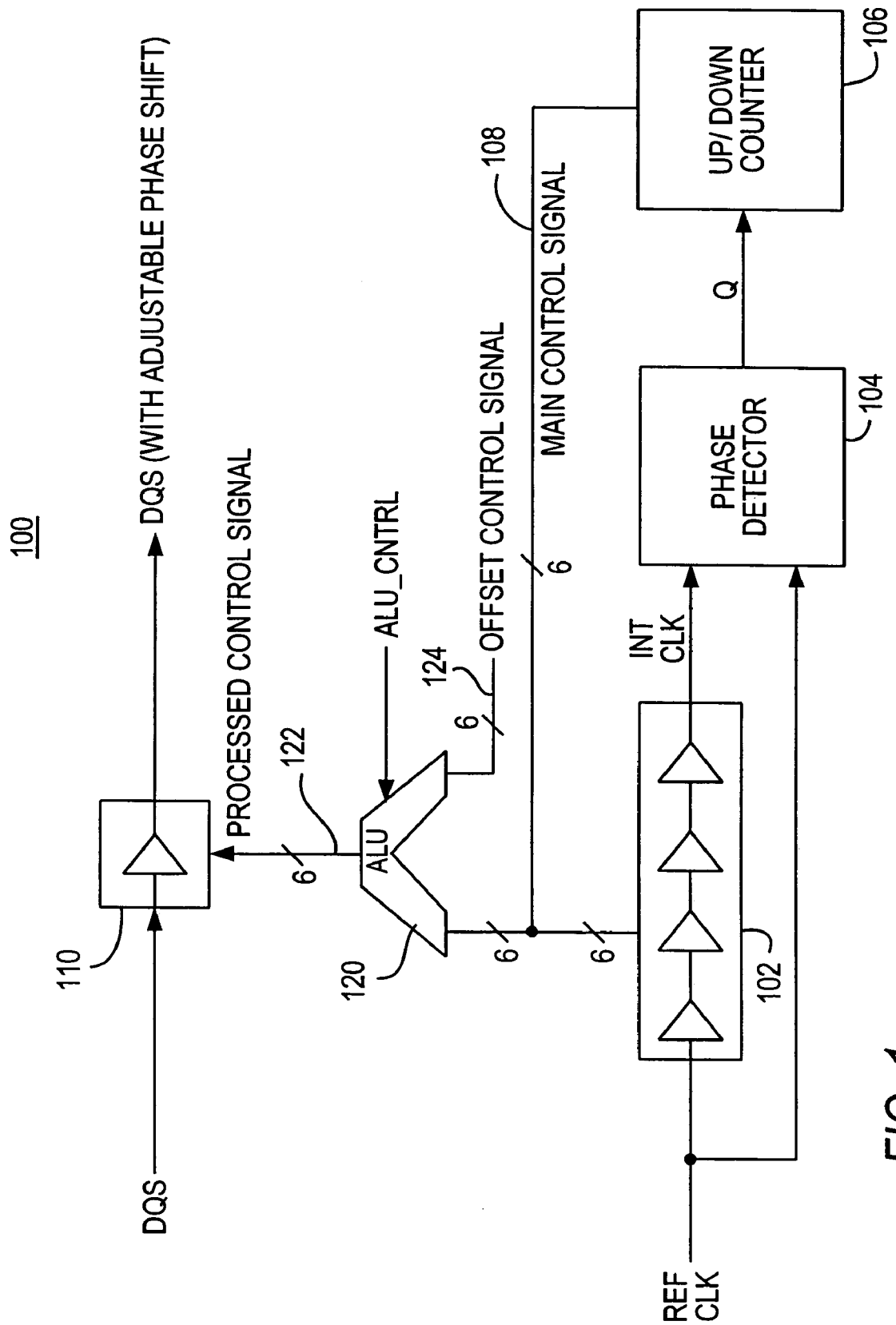
FIG. 1 is a simplified block diagram of an illustrative embodiment of a DLL circuit that provides phase shift control using a processed control signal in accordance with the principles of the present invention.

FIG. 1 shows a simplified block diagram of a first embodiment of a DLL circuit 100 that provides adjustable phase shift control using a processed control signal in accordance with the principles of the present invention. As illustrated in FIG. 1, DLL circuit 100 may be used in to provide a DQS with adjustable phase shift (as required, for example, by various memory interface standards). It will be understood, however, that the DLL circuits described herein (including DLL circuit 100) may be used for providing an adjustable phase shift to any suitable type of DLL clock signal, and that the description provided herein with regards to a phase shifted DQS is for illustration purposes only.

DLL circuit 100 includes a main variable delay circuit 102 that delays a reference clock signal REF CLK to provide an internal clock signal INT CLK. REF CLK may come from the output of an oscillator, another DLL circuit or any other suitable source. As illustrated in FIG. 1, main variable delay circuit 102 includes four delay stages. For the purpose of simplifying the description of the invention, the various delay stages of main variable delay circuit 102 are assumed to be identical (e.g., each delay stage includes the same number of delay steps, etc.). The invention, however, is not limited in this manner.

Phase detector 104 of DLL circuit 100 is used to detect a difference between the phase of INT CLK and the phase of REF CLK. It will be understood that phase detector 104 may be as simple as a register (not shown), where REF CLK is used to sample the delayed clock (i.e., INT CLK). Alternatively, phase detector 104 may be constructed using a D-type flip-flop (not shown), or any other suitable circuitry.

Based on a detected phase difference between INT CLK and REF CLK, phase detector 104 provides an output signal Q to up down counter 106, thereby causing up down counter 106 to either count up or count down, and main control signal 108 to adjust the delay setting of main variable delay circuit 102 accordingly. For example, if phase detector 104 determines that the phase of INT CLK leads the phase of REF CLK, then phase detector 104 provides an output signal Q that increments up down counter 106, causing main control signal 108 to increase the amount of delay introduced by main variable delay circuit 102 on REF CLK. On the other hand, if phase detector 104 determines that the phase of INT CLK lags the phase of REF CLK, then output signal Q phase detector 104 decrements up down counter 106, causing the amount of delay introduced by main variable delay circuit 102 on REF CLK to be reduced. In this manner, following each comparison made by phase detector 104, the difference in phase between INT CLK and REF CLK is reduced and is eventually brought close to zero. Once DLL circuit 100 is locked (e.g., INT CLK is substantially in phase with REF CLK), control signal 108 is set such that the delay by main variable delay circuit 102 equals one complete clock cycle of REF CLK.

DLL circuit 100 further includes a second, smaller variable delay circuit 110 for providing a phase shifted DQS, which is 1/K times the size of main variable delay circuit 102. As illustrated in FIG. 1, main variable delay circuit 102 includes four delay stages (as explained above), while smaller variable delay circuit 110 includes one delay stage. Accordingly, assuming that the single delay stage of smaller variable delay circuit 110 is substantially identical to each of the four delay stages of main variable delay circuit 102, K=4 for DLL circuit 100 (i.e., smaller variable delay circuit 110 is one-fourth the size of main variable delay circuit 102).

In accordance with the principles of the present invention, DLL circuit 100 also includes a processing circuit, ALU 120, for providing a processed control signal 122 to smaller variable delay circuit 110. As illustrated in FIG. 1, both main control signal 108 and processed control signal 122 (which is a processed version of main control signal 108) are six bit control signals. Accordingly, for example, each of the delay stages in variable delay circuits 102 and 110 will have $2^6$, or 64, delay steps, which are controlled in DLL circuit 100 by control signals 108 and 122, respectively. It will be understood, however, that the invention is not limited by the bit size of control signals 108 and 122. For example, control signals 108 and 122 may instead be eight bit control signals, in which case each of the delay stages in variable delay circuits 102 and 110 would instead have $2^8$, or 256, delay steps. Moreover, as explained in greater detail below, other embodiments of the present invention may be configured such that not all of the delay stages (when the smaller variable delay circuit includes more than one delay stage) are controlled by the processed control signal. Rather, in such instances, one or more of the delay stages may be controlled by the processed control signal while, for example, the remainder are controlled by the main control signal.

ALU 120 uses a main control signal 108 and a variable control signal (i.e., offset control signal 124) in producing processed control signal 122. In particular, ALU 120 produces processed control signal 122 by either adding or subtracting offset control signal 124 from main control signal 108, depending on the value of ALU function control signal, ALU_CNTRL. It will be understood that while ALU 120 separately receives offset control signal 108 and ALU_CNTRL, as illustrated in FIG. 1, the invention is not limited in this manner. For example, an additional bit may be added as either the most or least significant bit of offset control signal 108 to determine whether ALU 120 will add or subtract the remaining bits of offset control signal 124 from main control signal 108.

Persons skilled in the art will also appreciate that ALU 220 can be as simple as an adder that can do both addition and subtraction, or may be any other suitable type of circuitry. Moreover, it will further be understood that ALU_CNTRL and offset control signal 124 may be provided directly by user inputs, by configuration random access memory (CRAM) bits, or any other suitable source. Accordingly, the delay provided by smaller variable delay circuit 110, and thus the phase shift of DQS, can be dynamically adjusted during the operation of DLL circuit 100 by varying ALU_CNTRL and offset control signal 124.

In operation, processed control signal 122 of DLL circuit 100 generates DQS with a phase shift of $(360/K) \pm (S*A_D*\Delta w)$ when DLL circuit 100 is locked, where K=4 for DLL circuit 100 (as explained above) and S is the number of delay stages in smaller variable delay circuit 110 being controlled by processed control signal 122 (for DLL circuit 100, S=1). $A_D$, meanwhile, is the decimal equivalent of offset control signal 124 that will be used to offset main control signal 108 (i.e., either added to or subtracted from main control signal 108, as controlled by ALU_CNTRL), and Δw is the phase delay associated with each delay step of the various delay stages in variable delay circuits 102 and 110.

As an example, assume that each delay stage of variable delay circuits 102 and 110 has associated with it a minimum delay time ($T_0$) of 150 ps, and a minimum phase delay ($W_0$) of 16°. Moreover, assume that for each delay stage the time delay (Δt) associated with each of the 64 delay steps is 40 ps, and that REF CLK has a frequency of 300 MHz, in which case Δw is approximately 4.32°. The following is a table illustrating the respective time delays and equivalent phase shift values associated with each delay stage of either delay circuit 102 or delay circuit 110, where "Control Signal" is the control signal being used to control the respective delay circuit and $D_{CS}$ is its decimal equivalent.

TABLE 1

DELAY AND PHASE SHIFT VALUES

| Control Signal | $D_{cs}$ | Delay = $T_0$ + ($D_{cs}$ * Δt) | Phase Shift = $W_0$ + ($D_{cs}$ * Δw) |
|---|---|---|---|
| 000000 | 0 | 150 ps | 16° |
| 000001 | 1 | 190 ps | 20.32° |
| 000010 | 2 | 230 ps | 24.64° |
| 000011 | 3 | 270 ps | 28.96° |
| 000100 | 4 | 310 ps | 33.28° |
| 000101 | 5 | 350 ps | 37.60° |
| 000110 | 6 | 390 ps | 41.92° |
| ... | | ... | ... |
| ... | | ... | ... |
| 010000 | 16 | 790 ps | 85.12° |
| 010001 | 17 | 830 ps | 89.44° |
| 010010 | 18 | 870 ps | 93.76° |
| ... | | ... | ... |
| ... | | ... | ... |
| 111001 | 57 | 2,430 ps | 262.24° |
| 111010 | 58 | 2,470 ps | 266.56° |
| 111011 | 59 | 2,510 ps | 270.88° |
| 111100 | 60 | 2,550 ps | 275.20° |
| 111101 | 61 | 2,590 ps | 279.52° |
| 111110 | 62 | 2,630 ps | 283.84° |
| 111111 | 63 | 2,670 ps | 288.16° |

When DLL circuit 100 is locked at 300 MHz, the four delay stages of main variable delay circuit 102 will have a combined delay of one complete clock cycle (i.e., 360°), which is approximately 3.33 ns. Each of the four delay stages of main variable delay circuit 202 will thus have a delay of approximately 833 ps (which is one-fourth of the combined delay of the four delay stages).

As illustrated by Table 1, the closest delay provided by DLL circuit 200 using the values provided above is 830 ps. This amount of delay can be achieved through the use of 17 delay steps in each of the four delay stages of main variable control circuit 102, corresponding to a main control signal 108 of 010001. Without the use of ALU 120 (as in conventional DLL circuits), this value of main control signal 108 would be used to directly control the one delay stage of smaller variable delay circuit 110, resulting in a fixed DQS phase shift equaling approximately 90°.

To provide a DQS with an adjustable phase shift when DLL circuit 100 is locked (i.e., a phase shift that is not fixed once the value of K is set), ALU 120 is used to add or subtract offset control signal 124 from main control signal 108. For example, assume a 300 phase shift is desired for DQS. Solving the equation above for $A_D$ yields a value of −13.89 (rounded to −14). Accordingly, to achieve a phase shift for DQS closest to the desired 30°, ALU 120 is used to subtract an offset control signal 124 of 001110 (the binary equivalent of 14) from the main control signal 108 of 010001 that is being used to provide a one cycle delay by main variable delay circuit 102. In this manner, ALU 120 produces a processed control signal 122 of 000011 (the binary equivalent of 3). When provided to smaller variable delay circuit 110, which has only one delay stage, the adjustable phase shift of DQS is set to 28.96°, the closest phase shift to the desired 30°.

Alternatively, assume for example that a phase shift of 95° is desired. In this case, ALU 120 may be used to add an offset control signal 108 of 000001 (given that $A_D$=1 after rounding to the nearest integer) to main control signal 108, which as explained above is set to 010001 when DLL circuit 100 is locked. Accordingly, processed control signal 122 becomes equal to 010010, and smaller variable delay circuit 110 will produce DQS with 93.76° phase shift, the closest phase shift to the desired 95°. As demonstrated by these two examples, ALU_CNTRL and offset control signal 124 may be used to control the processed control signal 122 produced by ALU 120, and thus, to dynamically adjust the phase shift for DQS even after K is set.

As illustrated by the values shown in Table 1, the difference in phase between selectable phase shifts for a DQS when using DLL circuit 100 is equal to Δw, or 4.32°. It will be appreciated that, for DLL circuits using a smaller variable delay circuit having more than a single delay stage, the difference in phase between selectable phase shifts is equal to Δw multiplied by the number of delay stages in the smaller variable delay circuit being controlled by processed control signal 122. For example, assuming Δw=4.32° in a DLL circuit where the smaller variable delay circuit includes three delay stages each being controlled by processed control signal 122, the difference in phase between selectable phase shifts for a DQS will be approximately 13°. Therefore, in order to provide finer adjustability for the DQS phase shift provided, delay stages using delay steps that each introduce a smaller phase shift (i.e., less than 4.32°) may be used. As explained above, the parameters of the delay circuits used in providing a phase shifted DQS are not limited to the examples provided herein.

Moreover, it will also be understood by those skilled in the art that processed control signal 122 produced in accordance with the principles of the present invention does not need to be used to control each of the delay stages in smaller variable delay circuit 110. For illustrative purposes, assume that instead of one delay stage as illustrated in FIG. 1, smaller variable delay circuit 110 has two delay stages. In this case, rather than using processed control signal 122 to control both of the delay stages in smaller variable delay circuit 110, processed control signal 122 can be used to control one delay stage while main control signal 108 controls the other. As a result, the difference in phase between selectable phase shifts will not be increased by the inclusion of a second delay stage in smaller variable delay circuit 110 (i.e., S in the equation above will still be equal to one, the number of delay stages being controlled by processed control signal 122.

Figure 2:
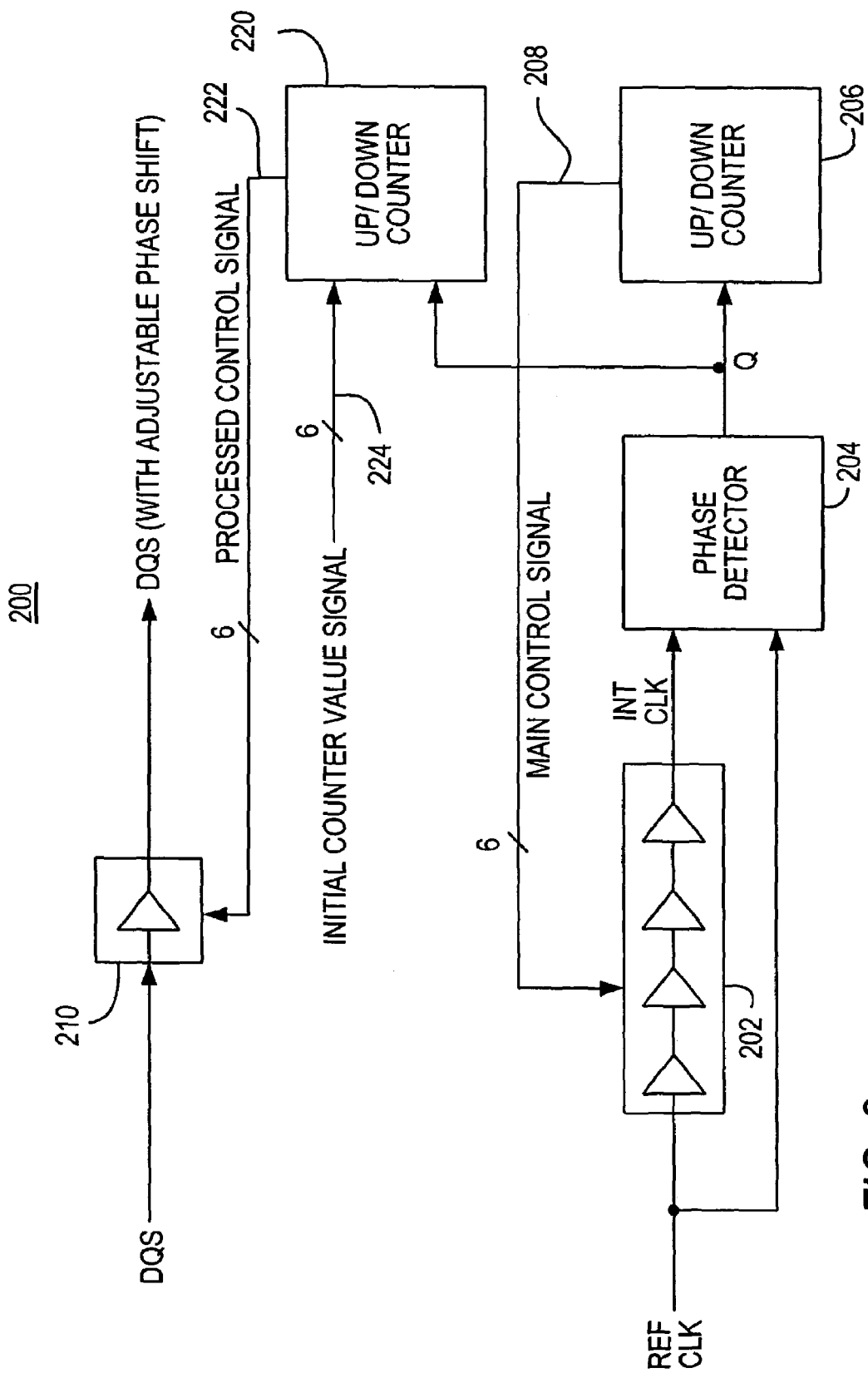
FIG. 2 is a simplified block diagram of an alternative embodiment of a DLL circuit that provides phase shift control using a processed control signal in accordance with the principles of the present invention.

FIG. 2 shows a simplified block diagram of a second embodiment of a DLL circuit 200 that provides adjustable phase shift control using a processed control signal in accordance with the principles of the present invention. DLL circuit 200 includes a main variable delay circuit 202, phase detector 204, up down counter 206 for producing main control signal 208 and smaller variable delay circuit 210, each of which operate substantially similarly to the corresponding components (and control signal) of DLL circuit 100. Moreover, as with DLL circuit 100, DLL circuit 200 operates through the use of six bit control signal, and thus, delay stages each having 64 delay steps in variable delay circuits 202 and 210. It should be understood, however, the invention is not limited in this manner.

In particular, phase detector 204 compares the phase difference between INT CLK (the delayed signal produced by main variable delay circuit 202) and REF CLK. On the basis of a detected phase difference between INT CLK and REF CLK, phase detector 204 provides an output signal Q to increment or decrement up down counter 206, thereby causing main control signal 208 to adjust the delay setting of main variable delay circuit 202. For example, assuming phase detector 204 measures INT CLK as leading REF CLK, output signal Q increments up down counter 106, thereby causing main variable delay circuit 202 to increase the amount of delay on REF CLK. On the other hand, if INT CLK is measured by phase detector 204 to be lagging REF CLK, output signal Q decrements up down counter 206, thereby causing main variable delay circuit 202 to decrease the amount of delay on REF CLK. In this manner, following each comparison of INT CLK and REF CLK by phase detector 204, and each subsequent adjustment to the delay setting of main variable delay circuit 202, the phase difference between these INT CLK and REF CLK is reduced. Eventually, the phase difference between INT CLK and REF CLK will be substantially close to zero, and DLL circuit 200 will become locked.

Once DLL circuit 200 is locked, control signal 208 is set such that the delay by main variable delay circuit 202 is equal to one clock cycle of REF CLK. Accordingly, the four delay stages of main variable delay circuit 202 will have a combined delay of one complete clock cycle (i.e., 360°). Assuming the same values used above in connection with DLL circuit 100 described above, the complete clock cycle delay is approximately 3.33 ns. Thus, each of the four delay stages of main variable delay circuit 202 has a delay of approximately 833 ps (which is one-fourth of the combined delay of the four delay stages), corresponding to a main control signal 208 of 010001.

DLL circuit 200, like DLL circuit 100, also includes a processing circuit to provide an adjustable phase shift to DQS (i.e., the phase shift is not fixed when the value of K for DLL circuit 200 is set). Unlike the processing circuit of DLL circuit 100 (which includes ALU 120), however, the processing circuit of DLL circuit 200 includes a second up down counter 220. In particular, second up down counter 220 provides a processed control signal 222 for generating DQS with a phase shift of $(360°/K) \pm (S*B_D*\Delta w)$ when DLL circuit 200 is locked, where K=4 for DLL circuit 200 and S is the number of delay stages in the smaller variable delay circuit 210 being controlled by processed control signal 222 (for DLL circuit 200, S=1). Moreover, $B_D$ is the decimal equivalent of initial value difference between counters 206 and 220 as set a variable control signal (i.e., initial counter value signal 224). In particular, counter 220 will initially be set to a value that is greater than or less than the value of counter 206 by an amount as determined by $B_D$. Moreover, $\Delta w$ is the phase delay associated with each delay step of the various delay stages in variable delay circuits 202 and 210.

As indicated above, initial counter value signal 224 is used to set the initial value of up down counter 220 to a different value than that of up down counter 206. During operation of DLL circuit 200, up down counter 220 counts up or down (i.e., it is incremented or decremented) synchronously with up down counter 206 based on the output signals Q from phase detector 204. Accordingly, the initial difference in value between counters 206 and 220 (as set by value signal 224) is maintained during operation of DLL circuit 200, and thus, so is the relationship between control signals 208 and 222. It will be understood that initial counter value signal 224 may be provided directly by user inputs, by CRAM bits or any other suitable source. The following examples illustrate the manner in which the phase shift for DQS may be adjusted by varying value signal 224.

Assume, for example, that main control signal 208 from up down counter 206 has an initial value of 100000 (the binary equivalent of 32), and that a DQS with 35° phase shift is desired. In this case, solving the equation above for $B_D$ results in a value of −12.73, which rounded to the nearest integer is −13. Accordingly, initial counter value signal 224 sets the initial value of up down counter 220 to 13 less than the value of counter 206, corresponding to an initial processed control signal 222 of 010010 (the binary equivalent of 32−13, or 19). Using the values of Table 1, when DLL circuit 200 becomes locked, up down counter 206 will have been decremented 15 times such that main control signal 208 has a value of 010001 (and each of the four delay stages of main variable delay circuit 202 provides a delay of 90°). Meanwhile, up down/counter 220 will also have been decremented 15 times, and thus, processed control signal 222 will have a value of 000100. Therefore, when DLL circuit 200 is locked, DQS will be phase shifted by 33.280, the closest available phase shift to the desired 35°.

As another example, assume that up down counter 206 has an initial value corresponding to a main control signal 208 of 000010 (the binary equivalent of 2), and that a 275° phase shifted DQS is desired. In this case, $B_D$ is rounded to 43, and thus, initial counter value signal 224 is set to 43 greater than the value of counter 206, corresponding to an initial processed control signal 222 of 101110 (the binary equivalent of 2+43, or 45). Using the values of Table 1, up down counter 206 will have been increased 15 times such that main control signal 208 has a value of 010001 (causing approximately 90° delay in each of the four delay stages of main variable delay circuit 202) when DLL circuit 200 is locked. Therefore, up down/counter 220 will also have been increased by 15, and processed control signal 222 will have a value of 111100 (the binary equivalent of 60). Accordingly, when DLL circuit 200 is locked, DQS will be phase shifted by 275.20°, the closest available phase shift to the desired 275°. As demonstrated by these past two examples, initial counter value signal 224 may be used to vary the value that processed control signal 222 will have when DLL circuit 200 is locked, and thus, to dynamically adjust the phase shift for DQS.

As with DLL circuit 100 explained above, it will be understood that processed control signal 222 does not need to be used to control each of the delay stages that may be present in smaller variable delay circuit 210. In particular, DLL circuit 200 may be constructed such that processed control signal 222 controls one or more stages in smaller variable delay circuit 210, while main control signal 208 controls the remaining delay stages. As previously explained, S in the equation above will be equal to the number of delay stages being controlled by processed control signal 222, and not simply to the number of delay stages present in delay circuit 210. The invention is not limited (in this or any other embodiment) by the number of delay stages in smaller variable delay circuit 210 being controlled by the processed control signal 222.

Figure 3:
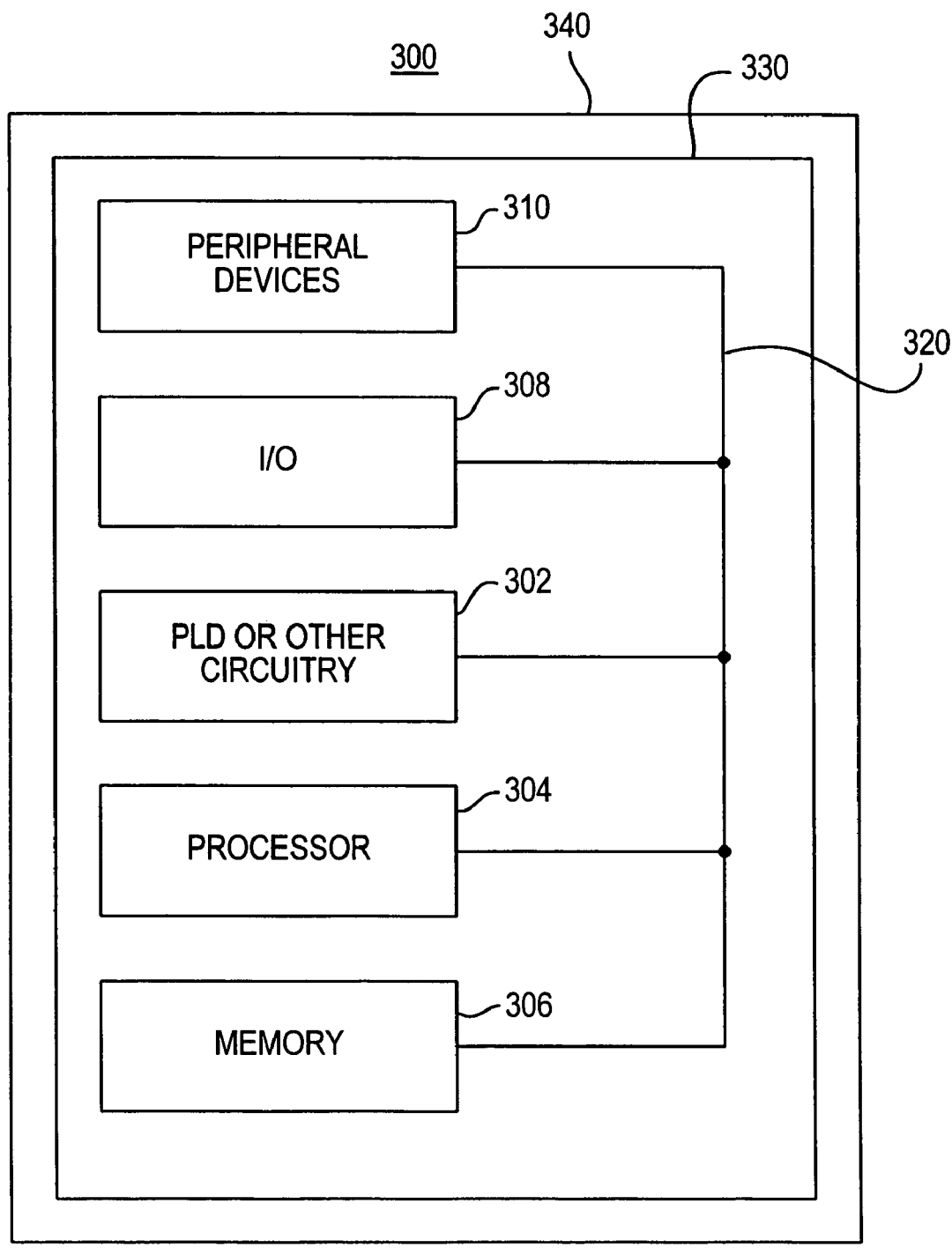
FIG. 3 is a simplified block diagram of an illustrative system employing a DLL circuit in accordance with the principles of the present invention.

It will be understood that DLL circuits, such as those illustrated in FIGS. 1 and 2, have many possible applications. As described above, either of DLL circuits 100 or 200 may be used, for example, in a PLD to provide a phase shifted DQS as required by several memory interface standards. FIG. 3 illustrates a data processing system 300 which includes a PLD or other circuitry 302 that uses a DLL circuit in accordance with this invention. Data processing system 300 may include one or more of the following components: a processor 304; memory 306; I/O circuitry 308; and peripheral devices 310. These components are coupled together by a system bus or other interconnections 320 and are populated on a circuit board 330 that is contained in an end-user system 340.

System 300 can be used in a wide variety of applications, such as computer networking, data networking, instrumentation, video processing, digital signal processing, or any other application. Circuitry 310 may be used to perform a variety of different logic functions. For example, circuitry 310 may be configured as a processor or controller that works in cooperation with processor 304. Circuitry 310 may also be used as an arbiter for arbitrating access to a shared resource in system 300. In yet another example, circuitry 302 can be configured as an interface between processor 304 and one of the other components in system 300. It should be noted that system 300 is only exemplary, and that the true scope and spirit of the invention should be indicated by the following claims.

Moreover, various technologies can be used to implement PLDs (like the circuitry 302 in FIG. 3 and the circuitry shown in the FIGS. 1–2). For example, the technology used can be based on EPROMs, EEPROMs, pass transistors, transmission gates, antifuses, laser fuses, metal optional links, mask programmability, function control registers (e.g., as in Wahlstrom U.S. Pat. No. 3,473,160), etc. The invention is not limited in this manner.

Persons skilled in the art will appreciate that the principles of the present invention are not limited to the specific embodiments described above. For example, while the DLL circuits 100 and 200 described above are used in a PLD to provide a phase shifted DQS signal, it will be understood that these circuits may also be used in other types of circuitry and to provide phase shifts for different types of signals (i.e., not just a DQS). Additionally, for example, while DQS and REF CLK are shown to be independent signals in FIGS. 1 and 2, the invention is not limited in this manner. For example, DQS and REF CLK may come from a single oscillator).

Furthermore, persons skilled in the art will appreciate that various features of the DLL circuits described herein may be changed without departing from the spirit of the present invention. For example, while DLL circuits have been described that produce an INT CLK that is in phase with REF CLK when the DLL circuits are locked, the invention is not limited in this manner. Rather, when clock distribution delay is to be accounted for, it may be desirable to provide an additional delay circuit between the output of the main variable delay circuit and the phase detectors, such that INT CLK leads REF CLK (instead of being matched in phase) when the DLL circuits are locked. Moreover, for example, the DLL circuits according to the invention can be either completely digital or partially analog. The above described embodiments of the present invention are presented for purposes of illustration and not of limitation, and the present invention is limited only by the claims which follow.

What is claimed is:

1. A circuit for providing a phase-shifted clock signal comprising:
    a first variable delay circuit controlled by a main control signal for producing an internal clock signal locked in phase with a reference clock signal;
    a phase detector for producing an output signal indicative of the phase difference between the internal clock signal and the reference clock signal;
    a first up down counter that provides the main control signal, wherein the main control signal is incremented or decremented based on the output signal from the phase detector;
    a second up down counter that provides the processed control signal, wherein the processed control signal is set to an initial offset value and is incremented or decremented based on the output signal from the phase detector; and
    a second variable delay circuit that receives a clock signal and outputs the phase-adjusted clock signal based on the processed control signal.

2. The circuit of claim 1, wherein the first and second up down counters are incremented or decremented synchronously based on the output signal from the phase detector.

3. The circuit of claim 1, wherein first variable delay circuit delays the internal clock signal by one clock period of the reference clock signal.

4. The circuit of claim 1, wherein the second variable delay circuit delays the clock signal by a fraction of the period of the reference clock plus a user-defined phase shift corresponding to the initial offset value.

5. The circuit of claim 1, wherein the second variable delay circuit comprises fewer delay elements than the first variable delay circuit.

6. The circuit of claim 1, wherein the reference clock signal and the clock signal are of the same frequency.

7. The circuit of claim 1, wherein the first and second variable delay circuits respond linearly to the main control signal and processed control signal.

8. A method for providing a phase-shifted clock signal comprising:
    adjusting the phase of an internal clock signal relative to a reference clock signal with a main control signal;
    determining the phase difference between the internal clock signal and the reference clock signal;
    incrementing or decrementing the main control signal based on the phase difference between the internal clock signal and the reference clock signal;
    incrementing or decrementing a processed control signal from an initial offset value based on the phase difference between the internal clock signal and the reference clock signal; and
    adjusting a clock signal based on the processed control signal to produce the phase-shifted clock signal.

9. The method of claim 8, wherein the processed control signal is incremented or decremented synchronously with the main control signal.

10. The method of claim 8, wherein the internal clock signal is delayed from the reference clock signal by one clock cycle of the reference clock signal.

11. The method of claim 8, wherein the clock signal is delayed by a fraction of the period of the reference clock signal plus a user-defined phase shift corresponding to the initial offset value.

12. The method of claim 8, wherein the reference clock signal and the clock signal are of the same frequency.

13. A circuit for providing a phase-shifted clock signal comprising:
- a delay locked loop circuit for producing an internal clock signal locked in phase with a reference signal, wherein the delay locked loop circuit is controlled by the output of a first up down counter that is incremented or decremented based on the phase difference between the reference signal and the internal clock signal;
- a second up down counter that is set to an initial offset value and is incremented or decremented synchronously with the first up down counter; and
- a variable delay circuit that receives a clock signal and is controlled by the output of the second up down counter to provide the phase-shifted clock signal.

14. The circuit of claim 13, wherein the delay locked loop circuit delays the internal clock signal by one period of the reference clock signal.

15. The circuit of claim 13, wherein the variable delay circuit delays the clock signal by a fraction of the period of the reference clock signal plus a user-defined phase shift corresponding to the initial offset value.

16. The circuit of claim 13, wherein the variable delay circuit comprises fewer delay elements than the delay-locked loop circuit.

17. The circuit of claim 13, wherein the reference clock signal and the clock signal are of the same frequency.

18. The circuit of claim 13, wherein delay locked loop circuit and the variable delay circuit respond linearly to the first and second up down counters.

* * * * *